(12) United States Patent
Lee

(10) Patent No.: US 6,228,735 B1
(45) Date of Patent: May 8, 2001

(54) METHOD OF FABRICATING THIN-FILM TRANSISTOR

(75) Inventor: Jia-Sheng Lee, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/212,086

(22) Filed: Dec. 15, 1998

(51) Int. Cl.⁷ ..................................................... H01L 21/20
(52) U.S. Cl. ...................... 438/384; 438/382; 338/225 D
(58) Field of Search ................................... 438/382, 383, 438/384, 385, 381; 338/225 D

(56) References Cited

U.S. PATENT DOCUMENTS

| | | | |
|---|---|---|---|
| 4,682,402 | * 7/1987 | Yamaguchi | 29/571 |
| 4,725,810 | * 2/1988 | Foroni et al. | 338/226 |
| 5,030,588 | * 7/1991 | Hosaka | 437/60 |
| 6,090,678 | * 7/2000 | Maghsoudnia | 438/382 |
| 6,140,198 | * 10/2000 | Liou | 438/382 |
| B1 6,180,479 | * 1/2001 | Yoshikawa | 438/384 |

* cited by examiner

Primary Examiner—John F. Niebling
Assistant Examiner—Viktor Simkovic
(74) Attorney, Agent, or Firm—Thomas, Kayden, Horstemeyer & Risley

(57) ABSTRACT

A method of fabricating thin film transistor. A thin oxide layer is formed as a protection layer for a thin film transistor. Since the oxide layer does not affect the fabrication process of a barrier layer, the thin oxide layer can be formed as the protection layer to protect the thin-film resist layer formed subsequently from being damaged by ions produced during dry etching process.

12 Claims, 5 Drawing Sheets

METHOD OF FABRICATING THIN-FILM TRANSISTOR

BACKGROUND OF THE INVENTION

1. Field of the Invention

The invention relates in general to a method of fabricating a semiconductor device, and more particularly, to a method of fabricating a thin film resistor of an interconnect by dual damascene.

2. Description of the Related Art

Dual damascene is a technique which fabricates planar and vertical interconnects at the same time. An insulation layer is formed on a substrate. After planarization, the pattern of conductive wires and contact window is transferred. The insulation layer is then etched to form a trench for the planar interconnects, and a contact window for vertical interconnects. A metal layer is formed to fill the trench and the contact window to form the conductive wires and the contact at the same time. The interconnection is thus achieved. Silicon has a certain solid solubility for metal at a high temperature. While a high temperature process is performed, a mutual diffusion occurs between silicon atoms and metal atoms to cause spikings. The spikings are often too long to cause a short circuit by piercing through the silicon. The short circuit affects the performance of devices greatly, and sometimes even causes a device failure. Therefore, a barrier layer is formed between a metal layer and a silicon layer to avoid the spiking effect, as well as to enhance the adhesion between silicon and metal.

A resistor is a component commonly used in both memory and logic circuit. The resistance of a resistor is a function of both the length and cross sectional surface area, that is, $R=\rho^{L/A}$, wherein, $\rho$ is the resistivity, L is the length through which current flowing, and A is the cross sectional surface area which current flowing through.

A resistor in an integrated circuit is typically formed by lightly doping a polysilicon region. Strips of polysilicon with various length and cross sections are formed as resistors with different resistance. Alternatively, resistors with various different resistance may also be formed by high resistant conductor and low resistant conductor. Typically, the low resistant conductor is formed by doped polysilicon, while the high resistant conductor is formed undoped polysilicon. As the integration of a semiconductor device is increased, the quality demand of material for forming the semiconductor device is raised. For example, to obtain a device with a reduced surface or volume, a resistor with a sufficiently high resistance has to be formed with a restricted dimension. However, the resistance per unit area and length of material such as polysilicon is limited, and thus, causes the difficulty for the fabrication of device with a high integration.

To increase the resistance per unit of a resistor, material such as chromium silicide ($Cr_xSi_y$) has been used to fabricate resistant layer to replace the doped or undoped polysilicon.

FIG. 1A to FIG. 1C shows a fabrication method for forming a thin film resistor.

In FIG. 1A, a substrate 100 is provided. A borophosphosilicate glass (BPSG) layer 102 is formed on the substrate 100. A thin film resistant layer 104 is formed on the BPSG layer 102. Using sputtering, a metal layer made of aluminum or alloy of aluminum/silicon/copper (Al/Si/Cu) 106 is formed on the BPSG layer 104 to protect the thin film resistant layer 104 from being etched in a subsequent dry etching process.

In FIG. 1B, the metal layer 106 is patterned, and the remaining metal layer 106a is formed as an etching mask for defining the underlying thin film resistant layer 104. The defined thin film resistant layer is denoted as 104a. The BPSG layer 102 is defined by dry etching to form a contact window 110 penetrating through the resultant BPSG layer 102a. A conductive layer 112 is formed over the substrate 100 and to fill the contact window 110.

In FIG. 1C, the conductive layer 112 is patterned as a conductive layer 11 2a of a conductive wire for interconnection 112a. The metal layer 106a is stripped to expose the thin film resistant layer 104a. After the formation of the thin film resistant layer 104a, an electric characteristic test is typically performed. A laser cutting machine is often used to cut the thin film resistant 104a into a thin film resistor with a required resistance. Therefore, the requirement of the circuit design can be more precisely achieved.

However, in the conventional method, an aluminum contained metal layer 106 is formed as a protection layer as the thin film resistant layer 104a. While a barrier layer is formed by material containing titanium, the aluminum in the protection layer will react with titanium. As a consequence, the protection layer cannot effectively protect the thin film resistant layer 104a. A conformal barrier for improving the adhesion between a contact window and a contact plug and to avoid the spike effect can not be formed in the contact window.

SUMMARY OF THE INVENTION

It is an object of the invention to provide a protection layer to protect a thin film resistant layer. In addition, the protection layer is not affected or damaged by the formation of a barrier layer.

To achieve the above-mentioned objects and advantages, a method of fabricating a thin film resistor is provided. A substrate having an insulating layer thereon is provided. The thin film resistor is formed to cover a part of the insulating layer. An oxide layer is formed on the thin film resistant layer and the insulation layer. The oxide layer and the insulating layer are patterned to form a contact window to expose a part of the substrate. A conformal barrier layer is formed to cover the oxide layer and the contact window surface. A part of the barrier layer and a part of the oxide layer are removed to expose the thin film resistor and a part of the insulating layer. A contact is formed to fill the contact window and a conductive pattern is formed on a part of the thin film resistor.

In the invention, a thin oxide layer is formed as a protection layer to protect the thin film resistor from being etched by ions during the subsequent dry etching process. Furthermore, a barrier layer is formed to enhance the adhesion between the contact and the contact window, so as to prevent the spiking effect without damaging the protecting layer.

Both the foregoing general description and the following detailed description are exemplary and explanatory only and are not restrictive of the invention, as claimed.

DESCRIPTION OF THE PREFERRED EMBODIMENTS

FIG. 2A to FIG. 2F are cross sectional views showing a method of fabricating a thin film resistor, while FIG. 3A to FIG. 3F are top views of FIG. 2A to FIG. 2F, respectively.

Figure 1A:
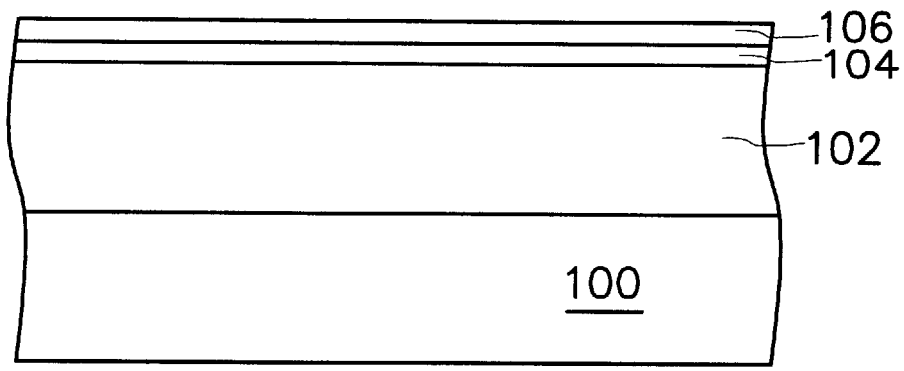
FIG. 1A to FIG. 1C show a conventional method of fabricating a thin film resistor.
Figure 1B:
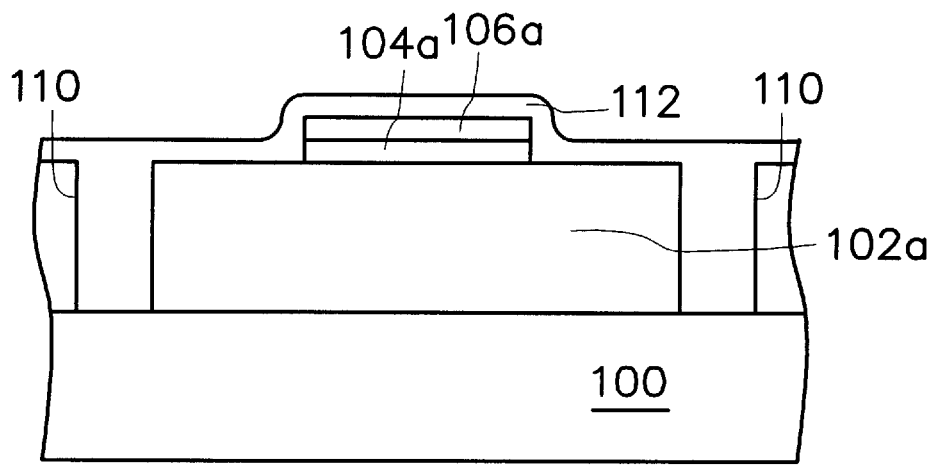
Figure 1C:
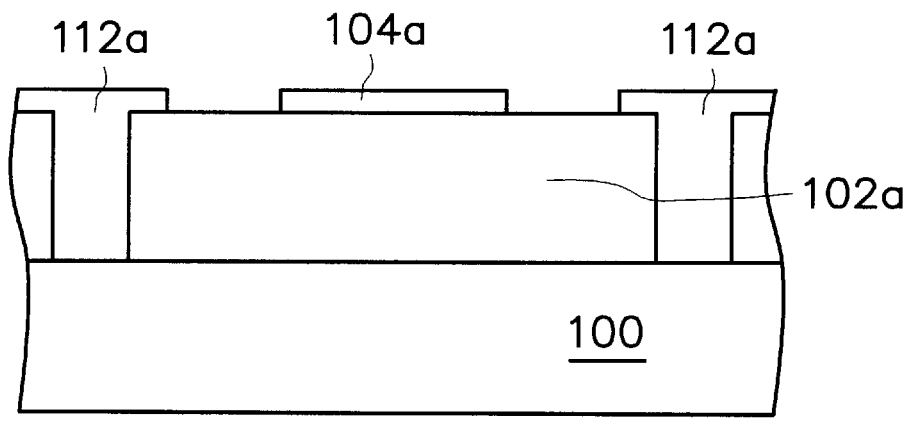
Figure 2A:
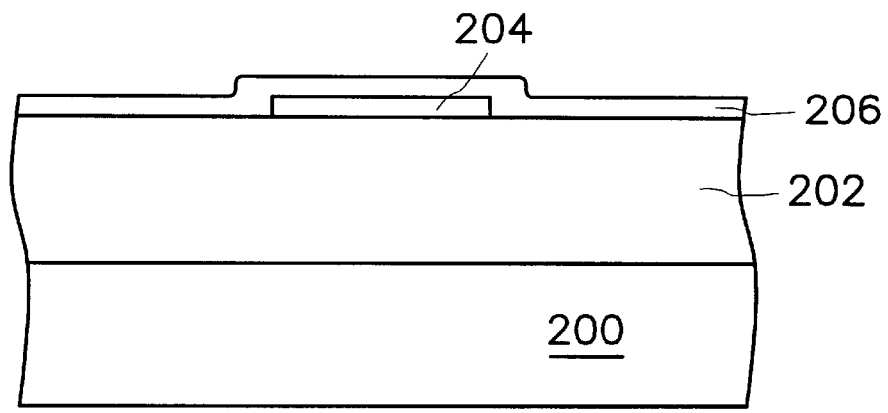
FIG. 2A to FIG. 2F show a method of fabricating a thin film resistor in a preferred embodiment according to the invention.
Figure 3A:
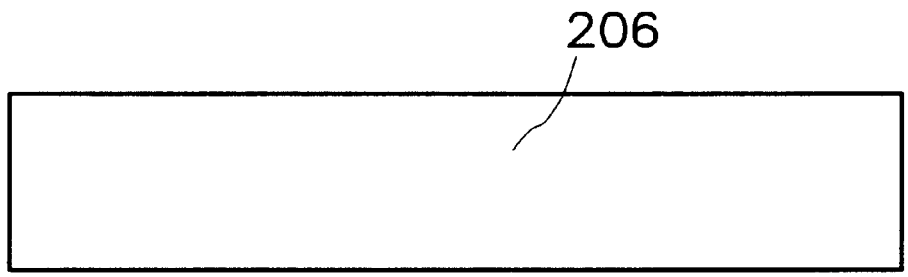
FIG. 3A to FIG. 3F are top views of FIG. 2A to FIG. 2F, respectively.

Referring to both FIG. 2A and FIG. 3A, a substrate 200 is provided. The substrate may comprise semiconductor devices or circuits (not shown). An insulating layer 202, for example, a BPSG layer, is formed on the substrate 200. A thin film resistor 204 (a patterned thin film resistant layer), for example, a chromium silicide formed by sputtering, is formed on the insulating layer 202. A thin oxide layer 206 is formed, for example, by chemical vapor deposition (CVD), on and conformal to the insulating layer 202. The thin oxide layer 206 is formed as a protecting layer to prevent the thin film resistor 204 from being damaged by ions during a subsequent dry etching process.

Figure 2B:
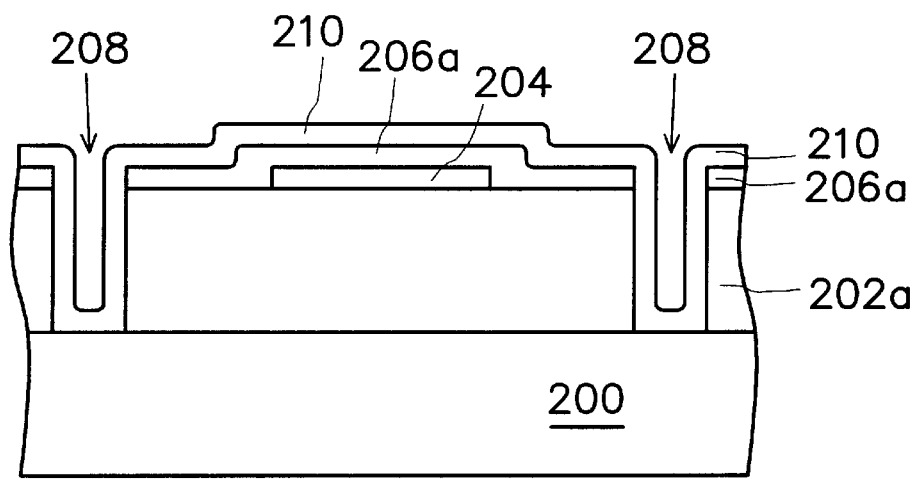
Figure 3B:
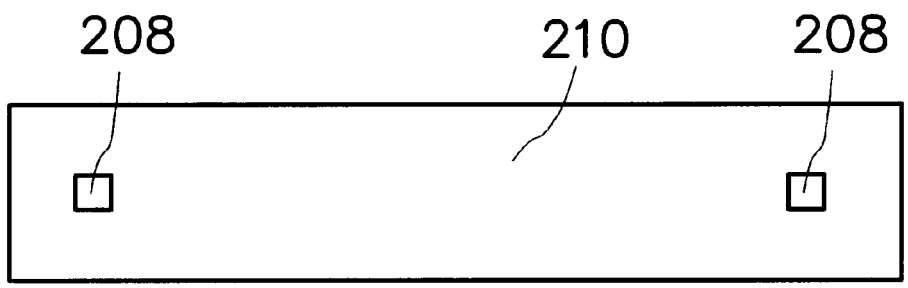

Referring to both FIG. 2B and FIG. 3B, the thin oxide layer 206 and the insulating layer 202 are patterned, for example, by photolithography and etching. A contact window 208 exposing a part of the substrate 200 is thus formed and penetrating resultant thin oxide layer 206a and the resultant insulating layer 202a. A conformal barrier layer 210, for example, a metal layer such as a titanium contained metal layer formed by sputtering, is formed on the thin oxide layer 206a and the surface of the contact window 208. The temperature of the substrate 200 is raised up to about 700° C., for example, by rapid thermal process (RTP). A chemical reaction thus occurs at the interface between the metal layer 210 and the contact window 208. That is, the metal contained in the barrier layer 210 is reacted with silicon contained in the substrate 200 exposed by the contact window 208 to form a metal silicide layer (not shown), for example, a titanium silicide layer ($TiSi_x$). By the formation of this metal silicide layer, the adhesion of the contact window for a metal plug is improved, and the spiking effect is eliminated.

Figure 2C:
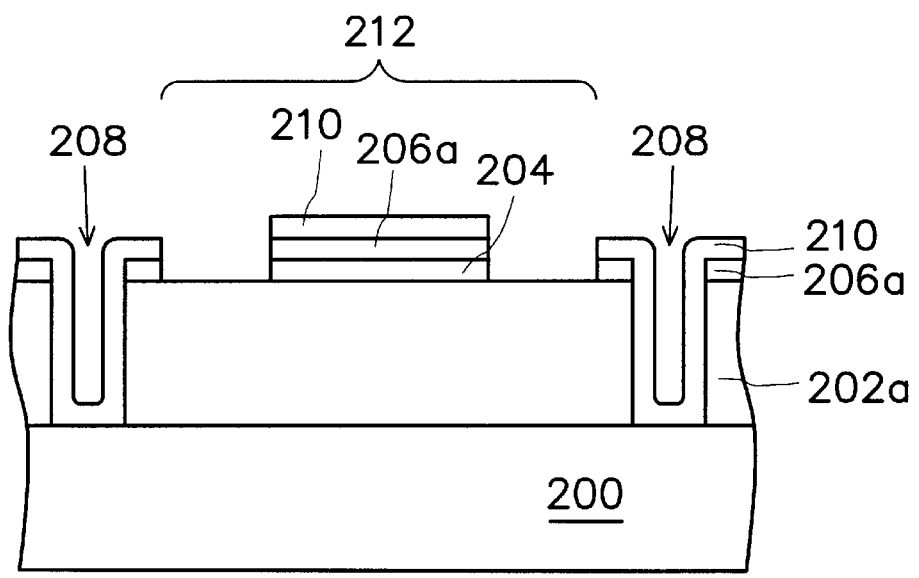
Figure 3C:
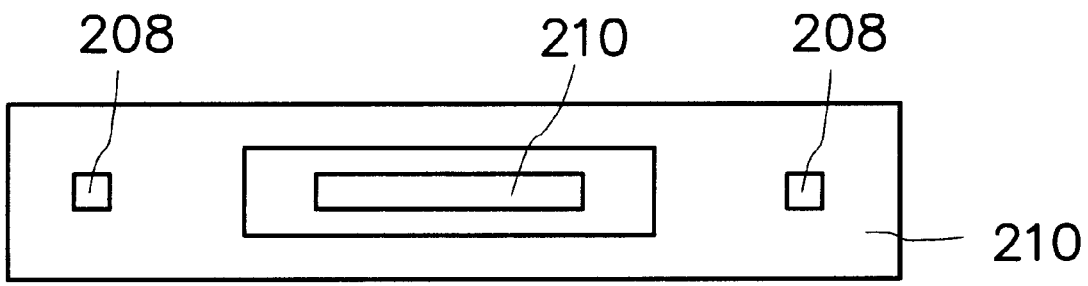

Referring to both FIG. 2C and FIG. 3C, portions of the barrier layer 210 and the thin oxide layer 206a are further removed, for example, by wet etching, to expose a part of the insulating layer 202a and to define a resistor region 212.

Figure 2D:
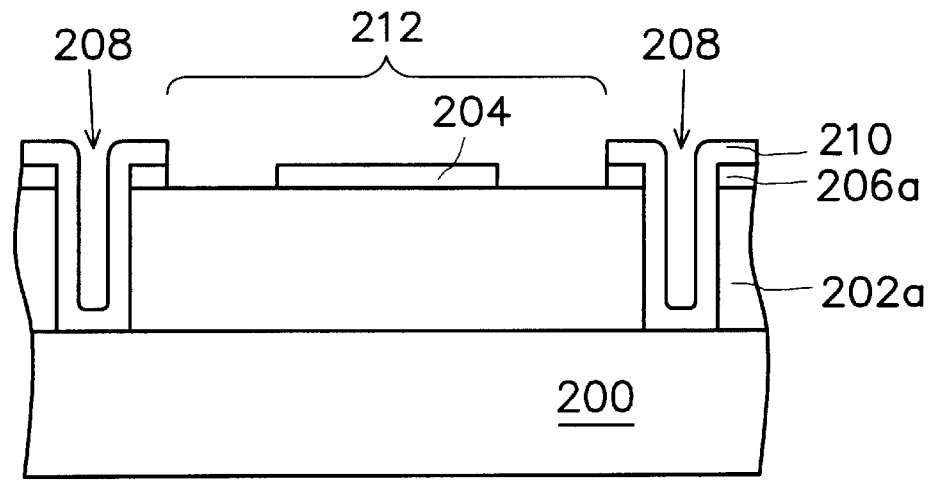
Figure 3D:
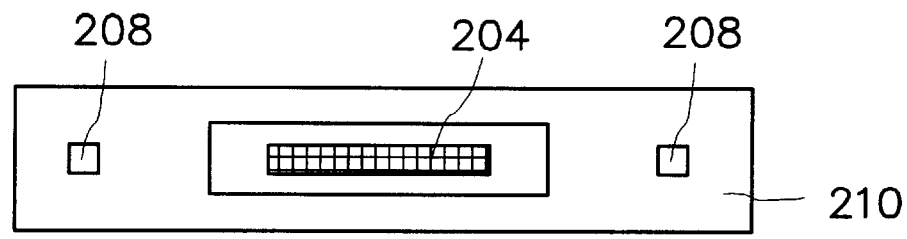

Referring to both FIG. 2D and FIG. 3D, the part of the barrier layer 210 and the thin oxide layer 206a over the thin film resistor 204 are removed to expose the thin film resistor 204.

Figure 2E:
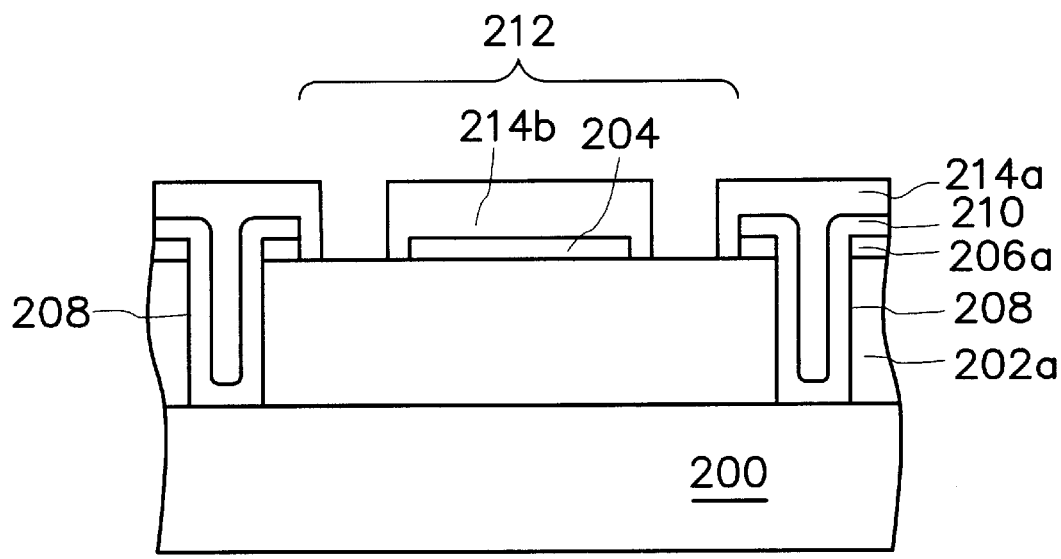
Figure 3E:
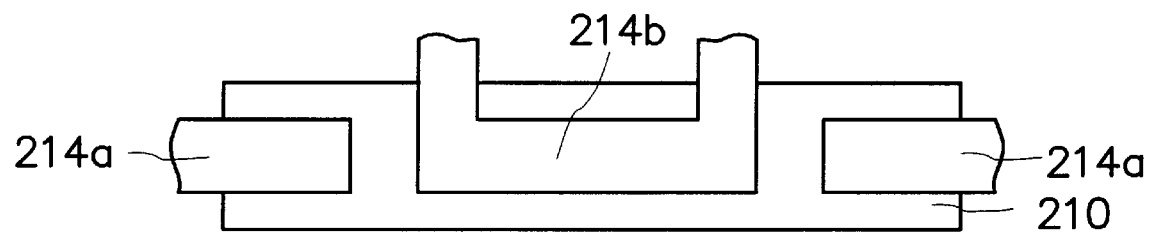

Referring to both FIG. 2E and FIG. 3E, a conductive layer is formed on the insulation layer 202a to cover the thin film resistor 204 and the remaining barrier layer 210, so as to fill the contact window 208. A contact, for example, a plug or a via, is thus formed to couple with the substrate 200. The conductive layer is patterned to form a conductive layer 214a covering the barrier layer 210, and a conductive layer, that is, the contact 214b covering the thin film resistor 204. The conductive layers 214a and 214b are the pattern for interconnects as specifically required. According to the requirement of circuit, the covering areas of the conductive layers 214a and 214b are different.

Figure 2F:
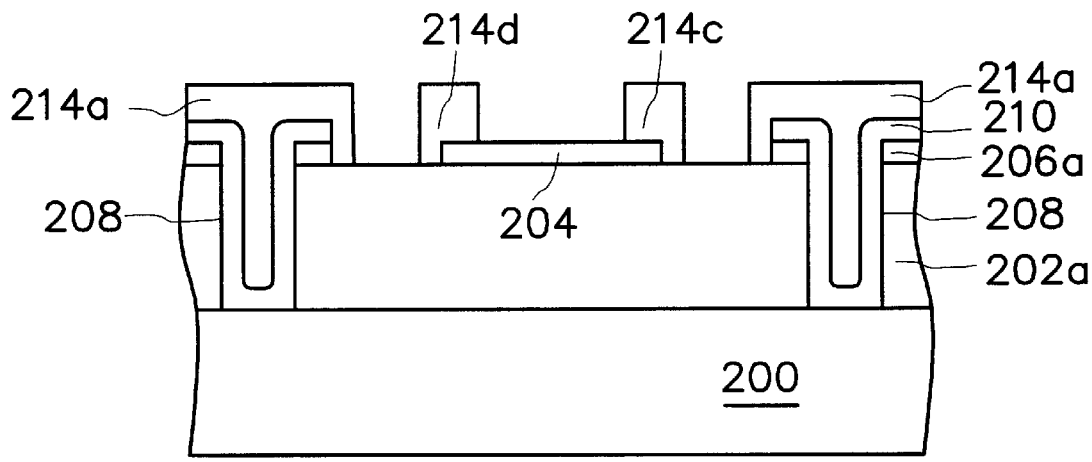
Figure 3F:
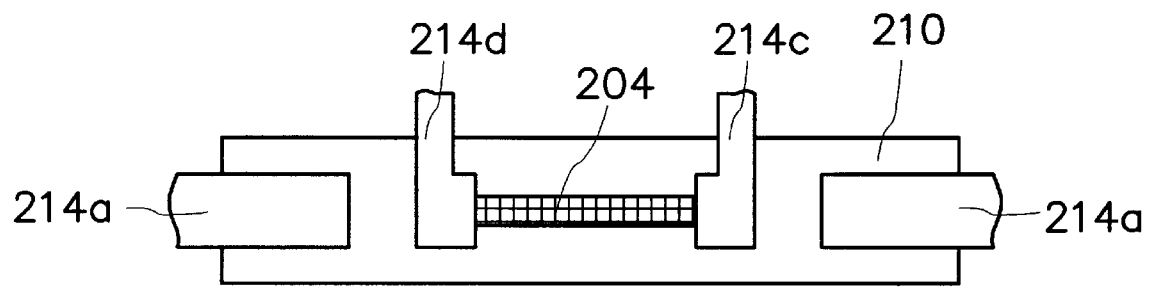

Referring to both FIGS. 2F and 3F, the conductive layer 214b is further defined to expose a part of the thin film resistant layer 204 and to form the resultant conductive wires 214c and 214d. In this example, the conductive wires 214c, 214d and the thin film resistant layer 204 are connected in series.

In this invention, a thin oxide layer is formed as a protecting layer to prevent the thin film resistant layer from being damaged by ions during a subsequent dry etching process. The titanium contained metal layer used in the conventional is replaced by the thin oxide layer in this embodiment. Therefore, the adhesion between a contact plug and the contact window is improved, and the spiking effect caused by the formation of the barrier layer in the prior technique is eliminated.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating thin film resistor, comprising:

providing a substrate having an insulating layer thereon;

forming the thin film resistor to cover a part of the insulating layer;

forming an oxide layer on the thin film resistant layer and the insulation layer;

patterning the oxide layer and the insulating layer to form a contact window to expose a part of the substrate;

forming a conformal barrier layer to cover the oxide layer and the contact window surface;

removing a part of the barrier layer and a part of the oxide layer to expose the thin film resistor and a part of the insulating layer; and forming a contact to fill the contact window and a conductive pattern on a part of the thin film resistor.

2. The method according to claim 1, wherein the thin film resistor is made of chromium silicide.

3. The method according to claim 1, the conductive pattern comprises two conductive wires locating on each edge of the thin film resistor in a way that the two conductive wires connecting with each other and the thin film resistor in series.

4. The method according to claim 1, comprising further the steps for forming the barrier layer:

forming a conformal metal layer on the oxide layer and the contact window surface; and performing a rapid thermal process.

5. The method according to claim 4, wherein the metal layer includes a titanium layer.

6. The method according to claim 4, wherein the rapid thermal process is performed at a temperature of about 700° C.

7. A method of fabricating a thin film resistor, comprising:

providing a substrate having an insulating layer thereon;

forming the thin film resistor to cover a part of the insulating layer;

forming an oxide layer on the thin film resistant layer and the insulation layer;

forming a contact window penetrating through the oxide layer and the insulating layer to expose a part of the substrate;

forming a conformal barrier layer to cover the oxide layer and the contact window surface;

removing the oxide layer and the insulating layer covering the insulating layer and the thin film resistor, so that the insulating layer between the resistor and the contact window is exposed;

forming a contact to fill the contact window and a conductive pattern covering an edge of the thin film resistor.

8. The method according to claim 7, wherein the thin film resistor is made of chromium silicide.

9. The method according to claim 7, the conductive pattern comprises two conductive wires locating on each edge of the thin film resistor in a way that the two conductive wires connecting with each other and the thin film resistor in series.

10. The method according to claim 7, comprising further the steps for forming the barrier layer:

forming a conformal metal layer on the oxide layer and the contact window surface; and performing a rapid thermal process.

11. The method according to claim 10, wherein the metal layer includes a titanium layer.

12. The method according to claim 10, wherein the rapid thermal process is performed at a temperature of about 700° C.

* * * * *